(12) United States Patent
Chang et al.

(10) Patent No.: US 9,584,111 B2
(45) Date of Patent: Feb. 28, 2017

(54) SYSTEMS AND METHODS FOR IMPROVING ENERGY EFFICIENCY OF GATE DRIVER CIRCUITS

(71) Applicant: APPLE INC., Cupertino, CA (US)

(72) Inventors: Ting-Kuo Chang, Cupertino, CA (US); Abbas Jamshidi-Roudbari, Sunnyvale, CA (US); Shin-Hung Yeh, Taipei (TW)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 14/502,883

(22) Filed: Sep. 30, 2014

(65) Prior Publication Data

US 2016/0094215 A1   Mar. 31, 2016

(51) Int. Cl.
*H03K 3/00* (2006.01)
*H03K 17/56* (2006.01)
*G09G 3/36* (2006.01)

(52) U.S. Cl.
CPC ............ *H03K 17/56* (2013.01); *G09G 3/3677* (2013.01)

(58) Field of Classification Search
None
See application file for complete search history.

(56) References Cited

U.S. PATENT DOCUMENTS

| | | | |
|---|---|---|---|
| 7,522,160 B2 | 4/2009 | Moon | |
| 8,022,899 B2 | 9/2011 | Takahara | |
| 2003/0218488 A1* | 11/2003 | Parulkar | G01R 31/31854 327/218 |
| 2004/0108884 A1* | 6/2004 | Morikawa | G11O 5/063 327/530 |
| 2004/0125664 A1* | 7/2004 | Yoon | G11C 7/1039 365/191 |
| 2006/0038764 A1 | 2/2006 | Takahashi et al. | |
| 2007/0201286 A1* | 8/2007 | Oh | G11C 7/1078 365/193 |
| 2008/0074936 A1* | 3/2008 | Kim | G11C 7/1039 365/189.15 |
| 2014/0168181 A1 | 6/2014 | Furuta et al. | |
| 2014/0225817 A1 | 8/2014 | Huang et al. | |
| 2015/0333534 A1* | 11/2015 | Liu | H02J 5/005 307/104 |
| 2016/0003901 A1* | 1/2016 | Park | G01R 31/31853 714/727 |

* cited by examiner

*Primary Examiner* — Lincoln Donovan
*Assistant Examiner* — Khareem E Almo
(74) *Attorney, Agent, or Firm* — Fletcher Yoder PC (57) ABSTRACT

A gate drive circuit may include a latch circuit, a first transmission gate, and a second transmission gate. The first transmission gate and the second transmission gate may both be directly coupled to the latch circuit and may be directly coupled to a first gate line and a second gate line, respectively. The latch circuit may receive an electrical signal from a third gate line adjacent to the second gate line, such that the electrical signal is configured to reset a state of the latch circuit.

23 Claims, 9 Drawing Sheets

SYSTEMS AND METHODS FOR IMPROVING ENERGY EFFICIENCY OF GATE DRIVER CIRCUITS

BACKGROUND

The present disclosure relates generally to electronic displays. More specifically, the present disclosure relates to improving the energy efficiency and/or profile (i.e., area occupied by gate drive circuit) of gate driver circuits used to illuminate pixels in an electronic display.

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

The bezel region or border of an electronic device generally includes the area of the electronic device between the edge of the device itself and a display region of the electronic device. Disposed within this bezel region are a number of electronic components that facilitate the operation of the display region. For instance, electronic components, such as gate drive circuits, disposed within the bezel region of the electronic device may provide electrical signals to components (e.g., pixels) in the display region to depict images on the display region. To depict images on the display region, these electronic components generally use a number of energy-consuming components such as latch circuits, transmission gate circuits, clock buses, and the like. Each of these energy-consuming components is typically disposed within the bezel region of the electronic device. As such, the number of electronic components disposed within the bezel region of the electronic device is directly proportional to the size of the bezel region.

Keeping this in mind, users generally prefer to have a larger display area with their respective electronic device. As such, the bezel region surround a display region of an electronic device may consume a valuable portion of the surface area of the electronic device that may rather be used as part of the display region. By reducing the number of electronic components disposed within the bezel region of the electronic device, the electronic device may improve its efficiency with regard to consuming energy while increasing the relative amount of surface area of the electronic device that includes the display region.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

The present disclosure generally relates to improving the energy efficiency of a display within an electronic device while reducing the bezel region of the electronic device. In particular, the present disclosure relates to using a single latch circuit to control the operation of at least two transmission gate circuits used to provide power to pixels along at least two respective gate lines of a display. In one embodiment, the latch circuit may store state information (e.g., active or inactive) and may use the state information to enable the corresponding transmission gate circuits to provide power to the corresponding gate lines. Other gate driver circuits that are not the subject of this disclosure may use an individual latch circuit to control the state of an individual transmission gate circuit in a 1:1 proportion. However, by using just one latch circuit to control the state of at least two transmission gate circuits in a 2:1 proportion (or greater), the embodiments disclosed herein enable the electronic device to have a smaller bezel region. Moreover, the reduced number of latch circuits and the scheme in which the latch circuits operate may reduce the total amount of energy consumed by the electronic display. Additional details regarding how a single latch circuit may be employed to control the states of at least two transmission gate circuits will be described below with reference to FIGS. 1-8.

Various refinements of the features noted above may exist in relation to various aspects of the present disclosure. Further features may also be incorporated in these various aspects as well. These refinements and additional features may exist individually or in any combination. For instance, various features discussed below in relation to one or more of the illustrated embodiments may be incorporated into any of the above-described aspects of the present disclosure alone or in any combination. The brief summary presented above is intended only to familiarize the reader with certain aspects and contexts of embodiments of the present disclosure without limitation to the claimed subject matter.

BRIEF DESCRIPTION OF THE DRAWINGS

Various aspects of this disclosure may be better understood upon reading the following detailed description and upon reference to the drawings in which.

DETAILED DESCRIPTION OF SPECIFIC EMBODIMENTS

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Figure 1:
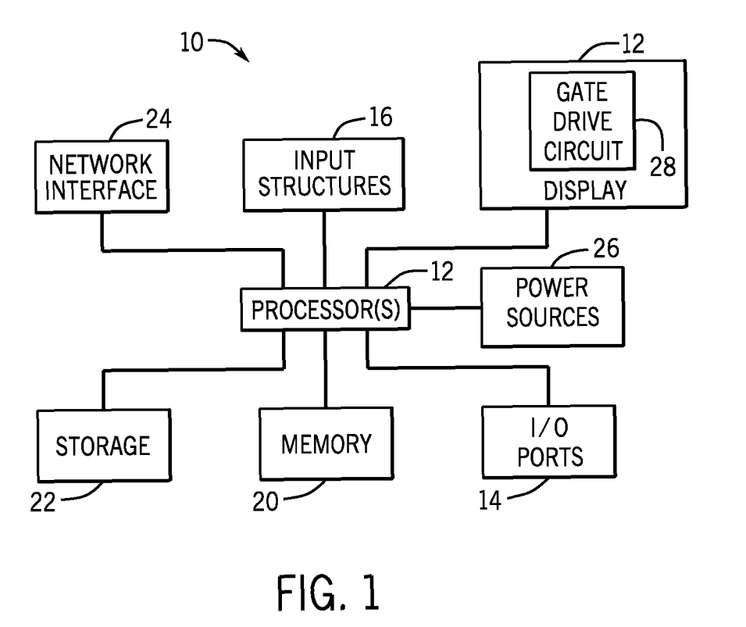
FIG. 1 is a block diagram of exemplary components of an electronic device, in accordance with an embodiment.

A variety of electronic devices may incorporate systems and methods for providing an energy-efficient gate drive circuit to illuminate pixels along gate lines within a display of an electronic device. An example of a suitable electronic device may include various internal and/or external components, which contribute to the function of the device. FIG. 1, for example, is a block diagram illustrating the components that may be present in such an electronic device 10 and which may allow the electronic device 10 to function in accordance with the systems and techniques discussed herein. Those of ordinary skill in the art will appreciate that the various functional blocks shown in FIG. 1 may include hardware elements (including circuitry), software elements (including computer code stored on a computer-readable medium), or a combination of both hardware and software elements. It should further be noted that FIG. 1 is merely one example of a particular implementation and is merely intended to illustrate the types of components that may be present in the electronic device 10. For example, in the presently illustrated embodiment, these components may include a display 12, I/O ports 14, input structures 16, one or more processors 18, a memory device 20, a non-volatile storage 22, a networking device 24, a power source 26, gate drive circuit 28, and the like.

With regard to each of these components, the display 12 may be used to display various images generated by the electronic device 10. Moreover, the display 12 may be a touch-screen liquid crystal display (LCD), for example, which may enable users to interact with a user interface of the electronic device 10. In some embodiments, the display 12 may be a MultiTouch™ display that can detect multiple touches at once. In any case, the display 12 may be coupled to gate drive circuit 28, which may provide electrical signals to the display 12, such that one or more images may be depicted on the display 12. That is, the gate drive circuit 28 may provide electrical signals to gate lines disposed within the display 12 to facilitate activation and deactivation of pixels along the respective gate lines within the display 12.

The I/O ports 14 may include ports configured to connect to a variety of external I/O devices, such as a power source, headset or headphones, peripheral devices such as keyboards or mice, or other electronic devices 10 (such as handheld devices and/or computers, printers, projectors, external displays, modems, docking stations, and so forth). The input structures 16 may include the various devices, circuitry, and pathways by which user input or feedback is provided to the processor 18. Such input structures 16 may be configured to control a function of the electronic device 10, applications running on the electronic device 10, and/or any interfaces or devices connected to or used by the electronic device 10.

The processor(s) 18 may provide the processing capability to execute the operating system, programs, user and application interfaces, and any other functions of the electronic device 10. The instructions or data to be processed by the processor(s) 18 may be stored in a computer-readable medium, such as the memory 20. The memory 20 may be provided as a volatile memory, such as random access memory (RAM), and/or as a non-volatile memory, such as read-only memory (ROM). The components may further include other forms of computer-readable media, such as the non-volatile storage 22, for persistent storage of data and/or instructions. The non-volatile storage 22 may include flash memory, a hard drive, or any other optical, magnetic, and/or solid-state storage media. The non-volatile storage 22 may be used to store firmware, data files, software, wireless connection information, and any other suitable data.

The network device 24 may include a network controller or a network interface card (NIC). Additionally, the network device 24 may be a Wi-Fi device, a radio frequency device, a Bluetooth® device, a cellular communication device, or the like. The network device 24 may allow the electronic device 10 to communicate over a network, such as a Local Area Network (LAN), Wide Area Network (WAN), or the Internet. The power source 26 may include a variety of power types such as a battery or AC power.

Figure 2:
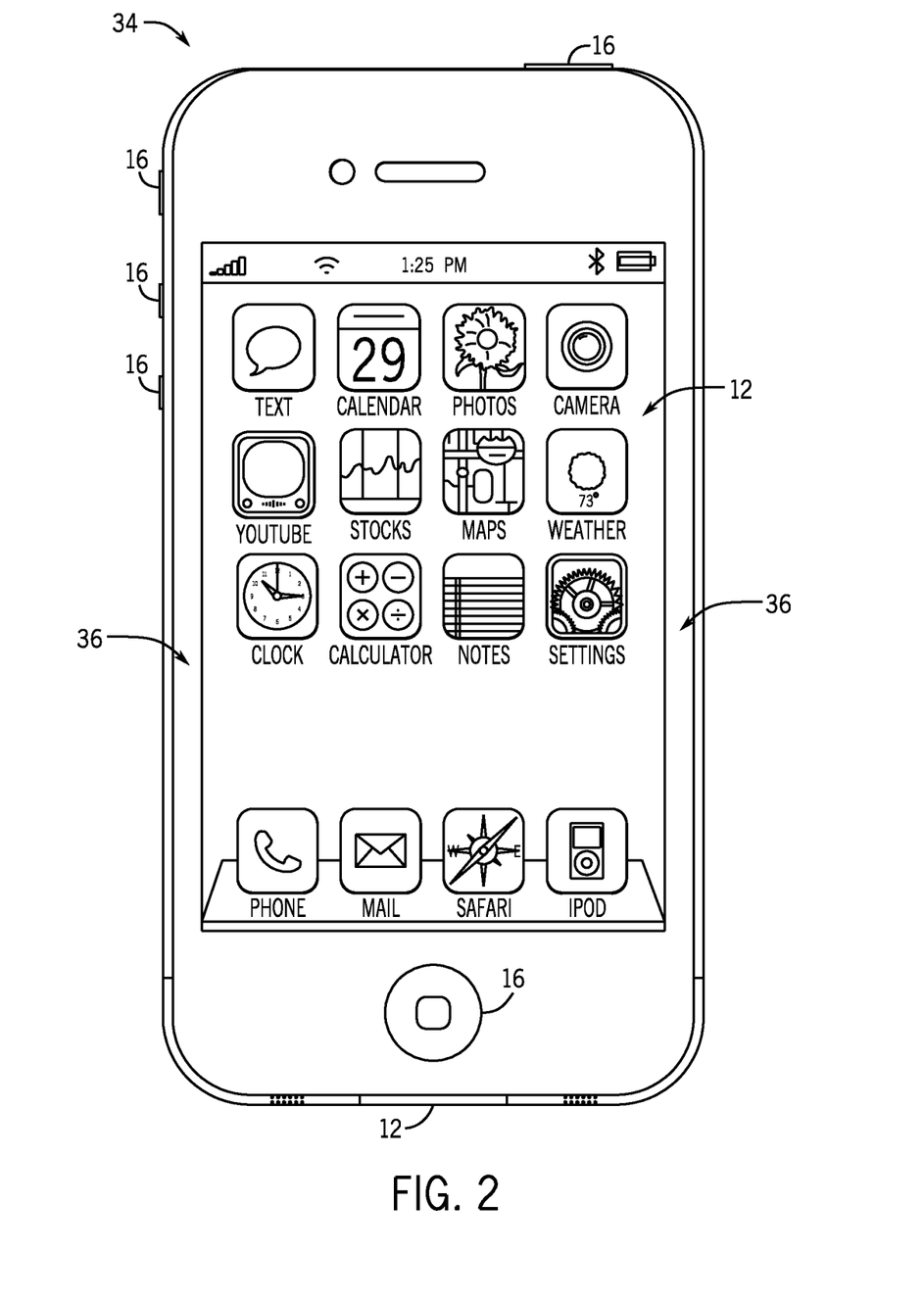
FIG. 2 is a front view of a handheld electronic device, in accordance with an embodiment.
Figure 3:
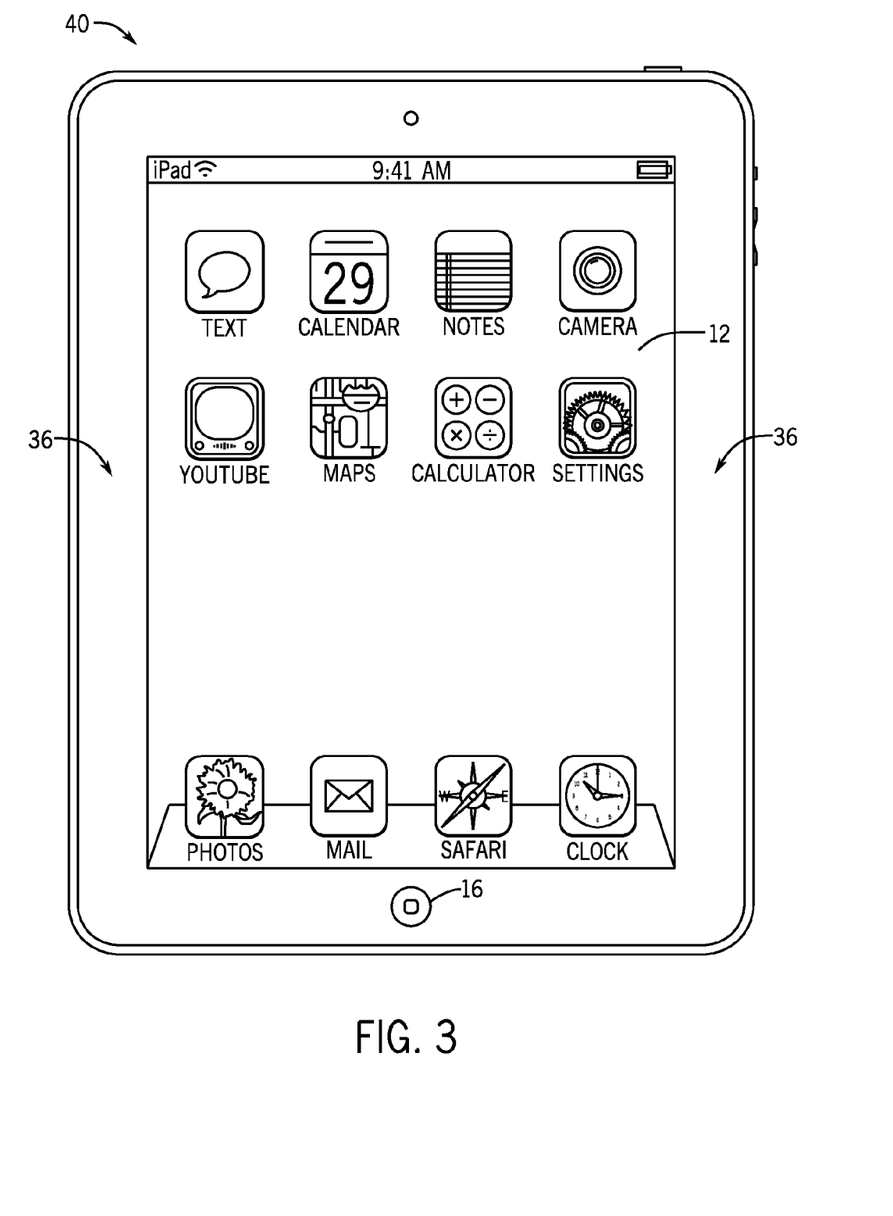
FIG. 3 is a front view of a tablet electronic device, in accordance with an embodiment.

With the foregoing in mind, FIG. 2 and FIG. 3 illustrate an electronic device 10 in the form of a handheld device 34 and a tablet device 40, respectively. FIG. 2 illustrates a cellular telephone, but it should be noted that while the depicted handheld device 34 is provided in the context of a cellular telephone, other types of handheld devices (such as media players for playing music and/or video, personal data organizers, handheld game platforms, and/or combinations of such devices) may also be suitably provided as the electronic device 10. As discussed with respect to the general electronic device 10 of FIG. 1, the handheld device 34 and the tablet device 40 may allow a user to connect to and communicate through the Internet or through other networks, such as local or wide area networks. The handheld electronic device 34 and the tablet device 40, may also communicate with other devices using short-range connections, such as Bluetooth® and near field communication. By way of example, the handheld device 34 may be a model of an iPod® or iPhone® available from Apple Inc. of Cupertino, Calif. Similarly, by way of example, the tablet device 40 may be a model of an iPad® from Apple Inc. of Cupertino, Calif.

The handheld device 34 and the tablet device 40 include an enclosure or body that protects the interior components from physical damage and shields them from electromagnetic interference. The enclosure may be formed from any suitable material such as plastic, metal or a composite material and may allow certain frequencies of electromagnetic radiation to pass through to wireless communication circuitry within the handheld device 34 and the tablet device 40 to facilitate wireless communication. In the depicted embodiment, the enclosure includes user input structures 16 through which a user may interface with the device. Each user input structure 16 may be configured to help control a device function when actuated. The handheld electronic device 34 and the tablet device 40 also may include various input and output (I/O) ports that allow connection of the handheld device 34 and the tablet device 40 to external devices.

Figure 4:
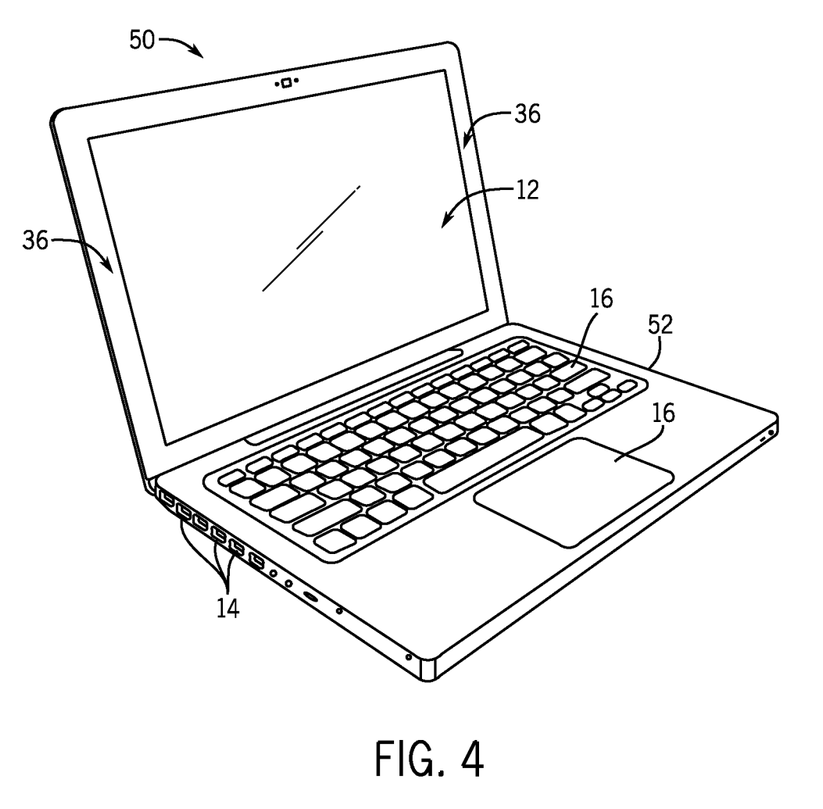
FIG. 4 is a view of a computer, in accordance with an embodiment.

In addition to handheld device 34 and the tablet device 40, the electronic device 10 may also take the form of a computer or other type of electronic device. Such computers may include computers that are generally portable (such as laptop, notebook, and tablet computers) as well as computers that are generally used in one place (such as desktop computers, workstations, and/or servers). In certain embodiments, the electronic device 10 in the form of a computer may be a model of a MacBook®, MacBook® Pro, MacBook Air®, iMac®, Mac® mini, iPad® or Mac Pro® available from Apple Inc. By way of example, an electronic device 10 in the form of a laptop computer 50 is illustrated in FIG. 4 in accordance with one embodiment. The depicted computer 50 includes a housing 52, a display 12, a bezel region 36, input structures 16, and input/output ports 14.

In one embodiment, the input structures 16 (such as a keyboard and/or touchpad) may be used to interact with the computer 50, such as to start, control, or operate a GUI or applications running on the computer 50. For example, a keyboard and/or touchpad may allow a user to navigate a user interface or application interface displayed on the display 12.

As depicted, the electronic device 10 in the form of the computer 50 may also include various input and output ports 14 to allow connection of additional devices. For example, the computer 50 may include an I/O port 14, such as a USB port or other port, suitable for connecting to another electronic device, a projector, a supplemental display, and so forth. The computer 50 may include network connectivity, memory, and storage capabilities, as described with respect to FIG. 1. As a result, the computer 50 may store and execute a GUI and other applications.

In the depicted embodiments, the handheld device 34, the tablet device 40, and the computer 50 each includes the display 12. The display 12 may be a touch-screen LCD used to display a graphical user interface (GUI) that allows a user to interact with the handheld device 34, the tablet device 40, or the computer 60. A border region along each side of the display 12 may be characterized as a bezel region 36. The bezel region 36 may include the area of the handheld device 34, the tablet device 40, or the computer 50 between the edge of the display 12 and the edge of the device itself. Generally, the gate drive circuit 28 may be disposed within the bezel region 36. As such, the gate drive circuit 28 may provide gate drive signals to gate lines within the display 12, thereby illuminating pixels disposed along the gate lines.

In operation, a source driver circuit may receive image data from the processor 18 and, based on the received data, outputs signals to control the pixels of the display 12. To display the image data, the source driver circuit may adjust the voltage of pixel electrodes disposed along a row across the display 12. To access an individual row of pixels, the gate drive circuit 28 may send an activation signal to thin film transistors (TFTs) associated with the particular row of pixels along a particular gate line. This activation signal may render the TFTs on the gate line conductive. Accordingly, the image data corresponding to the addressed row may be transmitted from the source driver circuit to each of the pixels along the gate lines via data lines disposed within the display 12. Thereafter, the gate drive circuit 28 may deactivate TFTs in along the gate line, thereby impeding the pixels within that gate line from changing state until the next time they are addressed. As this process is repeated for each gate line (i.e., row) of pixels in display 12, the display 12 may depict the image data as a viewable image.

Less Efficient Gate Drive Circuitry

Figure 5:
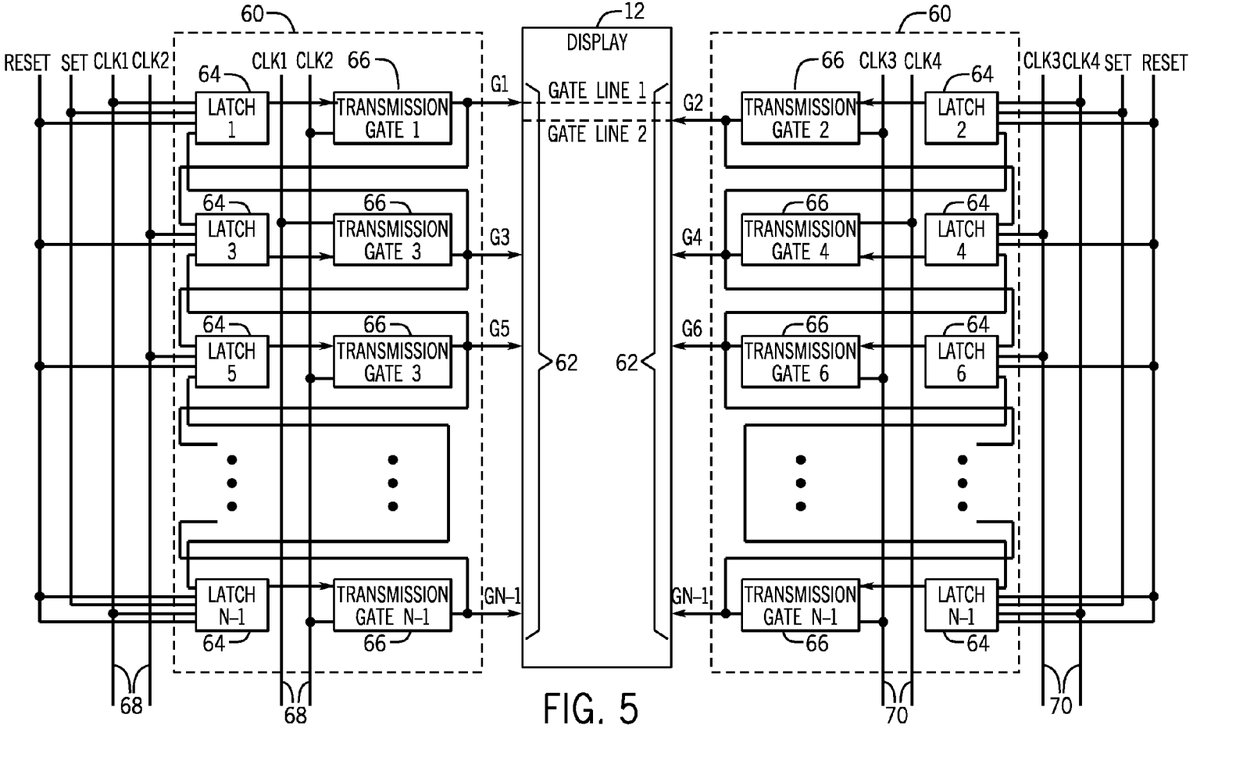
FIG. 5 is a block diagram of a less efficient gate drive circuit coupled to a display of an electronic device, in accordance with an embodiment.
Figure 7:
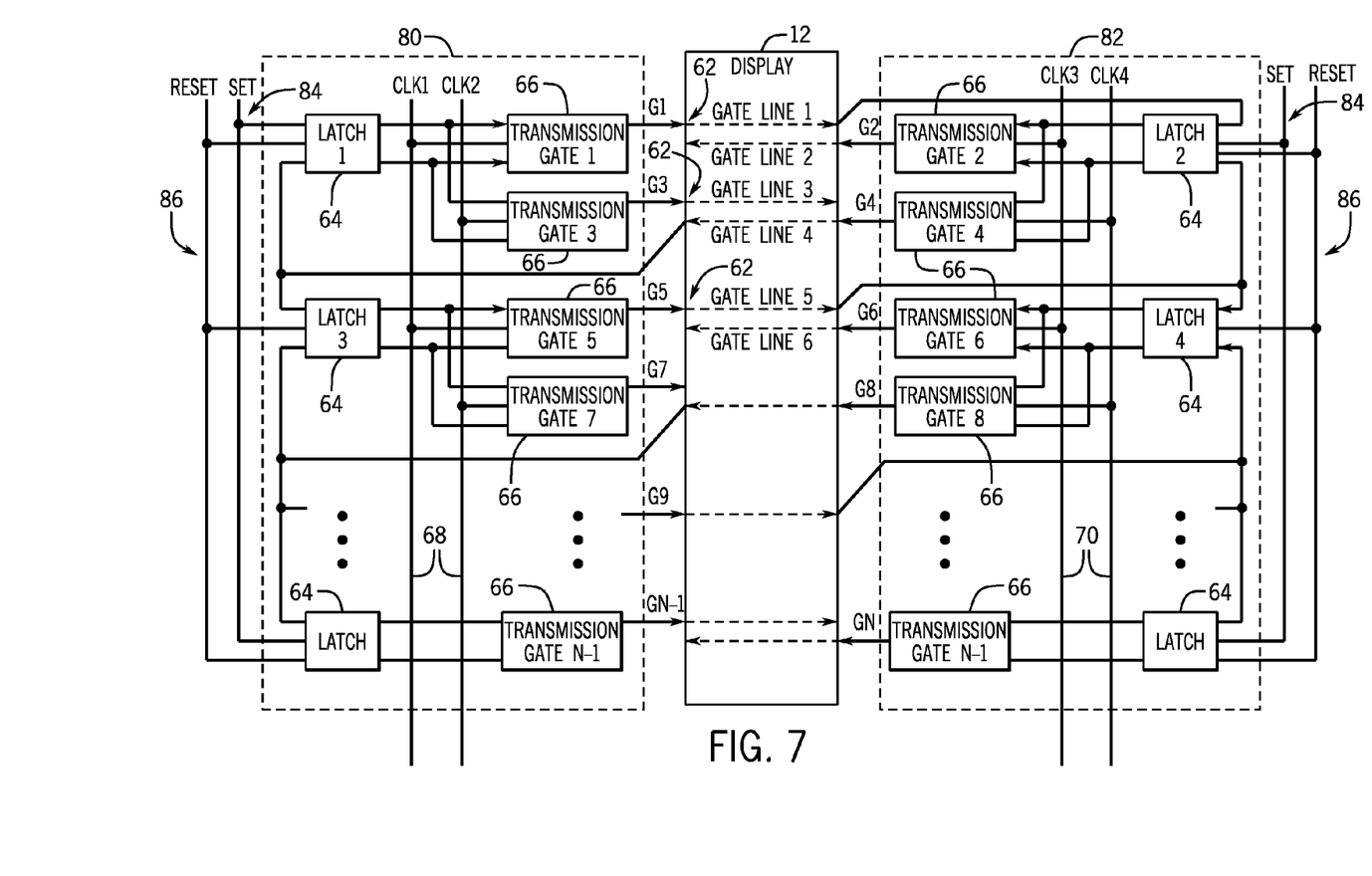
FIG. 7 is a block diagram of a gate drive circuit having improved energy efficiency as compared to the gate drive circuit of FIG. 5, in accordance with an embodiment.

Keeping the foregoing in mind, FIG. 5 illustrates a block diagram of two gate drive circuits 60 that are provided as examples of less efficient circuitry than the efficient gate drive circuitry of FIG. 7, which is the subject of this disclosure. As will be appreciated, the more efficient gate drive circuitry of FIG. 7 may consume less energy and use fewer parts as compared to the less efficient gate drive circuitry of FIG. 5.

Referring now to FIG. 5, the less efficient gate drive circuits 60 that may drive gate lines 62 of the display 12. As such, the gate drive circuit 60 may include a number of latch circuits 64 and an equal number of transmission gates 66. Each latch circuit 64 and transmission gate 66 pair may be used to drive a respective gate line 62 of the display 12. As shown in FIG. 5, one gate drive circuit 60 is provided on both sides of the display 12, and each gate drive circuit 60 may drive every other gate line 62 of the display 12. That is, for example, the gate drive circuit 60 on the left side of the display 12 may drive odd-numbered gate lines 62 (e.g., 1, 3, 5, . . . N−1) while the gate drive circuit 60 on the right side of the display 12 may drive even-numbered gate lines 62 (e.g., 2, 4, 6, . . . N).

Generally, the latch circuit 64 may be a flip-flop circuit, such as a D flip-flop circuit, that may store state information (e.g., on/off, high/low, active/inactive etc.). The latch circuit 64 may then use the stored state to control the operation of a corresponding transmission gate 66. The transmission gate 66 may be coupled to a corresponding gate line 62 and may provide the corresponding gate line 62 with an electrical signal to drive or illuminate one or more pixels located along the respective gate line 62 of the display 12.

When initializing its state, the latch circuit 64 may use a clock signal received via bus lines 68. As shown in FIG. 5, each of the bus lines 68 may be associated with a particular clock signal. Generally, one side of the display 12 may include bus lines 68 that provide two clock signals (e.g., clock 1 and clock 2) while the other side of the display 12 may include bus lines 70 that provide another two clock signals (e.g., clock 3 and clock 4). A timing diagram illustrating an example of four clock signals associated with the four clocks of bus lines 68 and 70 is provided in FIG. 6.

In operation, the latch circuit 64 may receive a pulse from a first clock signal that may cause the latch circuit 64 to change states (e.g., from inactive to active). The latch circuit 64 may then transfer the new state status to a respective transmission gate 66. At that time, or after receiving the new state status, the transmission gate 66 may be prepared to drive a respective gate line 62 based on a second clock signal. In addition to being coupled to a respective gate line 62, the output of the transmission gate 66 may be coupled to another latch circuit 64 and may cause the other latch circuit 64 to change states (e.g., from inactive to active). In some instances, the output of the transmission gate 66 may also be coupled to a latch circuit 64 associated with an immediately preceding gate line. In this way, the output of the transmission gate 66 may be used to reset or change the state of the latch circuit 64 associated with the immediately preceding gate line back to an inactive state.

Figure 6:
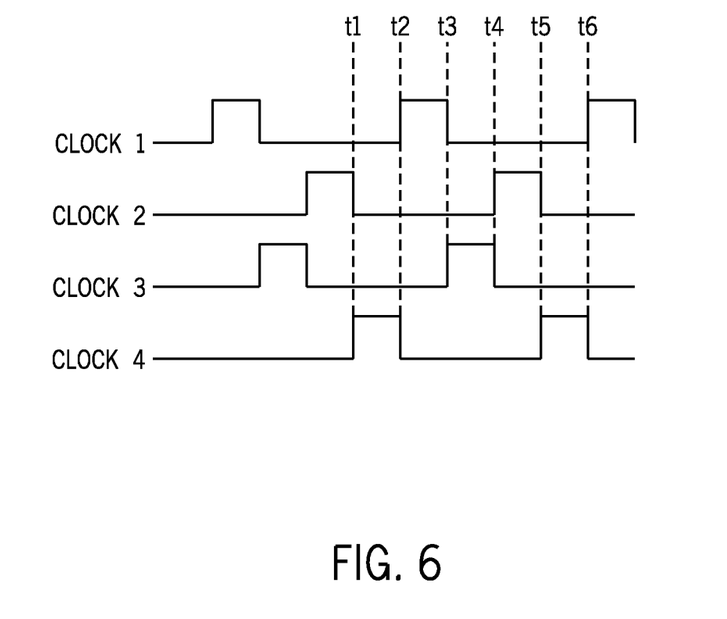
FIG. 6 is a timing diagram of clock signals that may correspond to the operation of the gate drive circuit of FIG. 5, in accordance with an embodiment.

To further illustrate the operation of the gate drive circuit 60, the following discussion with regard to the operations of certain latch circuits 64 and transmission gates 66 is provided. Accordingly, by way of example, latch 1, as illustrated in FIG. 6, may receive a first clock signal from clock 1. Upon receiving the first clock signal, latch 1 may become set or change states from inactive to active. Latch 1 may then forward the new state information (e.g., active) to transmission gate 1, such that transmission gate 1 is active and ready to drive gate line 1. Once active, transmission gate 1 may receive a second clock signal from clock 2 that may cause transmission gate 1 to drive gate line 1.

The next latch circuit 62, or latch 3, may be coupled to the output of transmission gate 1. As such, upon receiving the output from the transmission gate 1, latch 3 may enter into an active state. Latch 3 may then, in turn, activate transmission gate 3 according to its active state. As shown in FIG. 5, transmission gate 3 may be coupled to clock 1 and thus may drive gate line 3 based on the first clock signal received via clock 1. Like the output of transmission gate 1, the output of the transmission gate 3 may be coupled to the next latch (e.g., latch 5) of the gate drive circuit 60 causing latch 5 to set when transmission gate 3 outputs an electrical signal to gate line 3. In addition being coupled to the next latch, the output of transmission gate 3 may be coupled to latch 1. As such, since latch 1 is active prior to when transmission gate 3 outputs an electrical signal to gate line 3, once transmission gate 3 outputs the electrical signal to gate line 3, the electrical signal may also be provided to latch 1, thereby causing latch 1 to reset. The remaining latch circuits 64 and transmission gates 66 may be configured according to the same wiring scheme described above. As such, each transmission gate 66 of the gate drive circuit 60 may drive a respective gate line 62 of the display 12. The above process then continuously repeats to continuously display images on the display 12.

Figure 8:
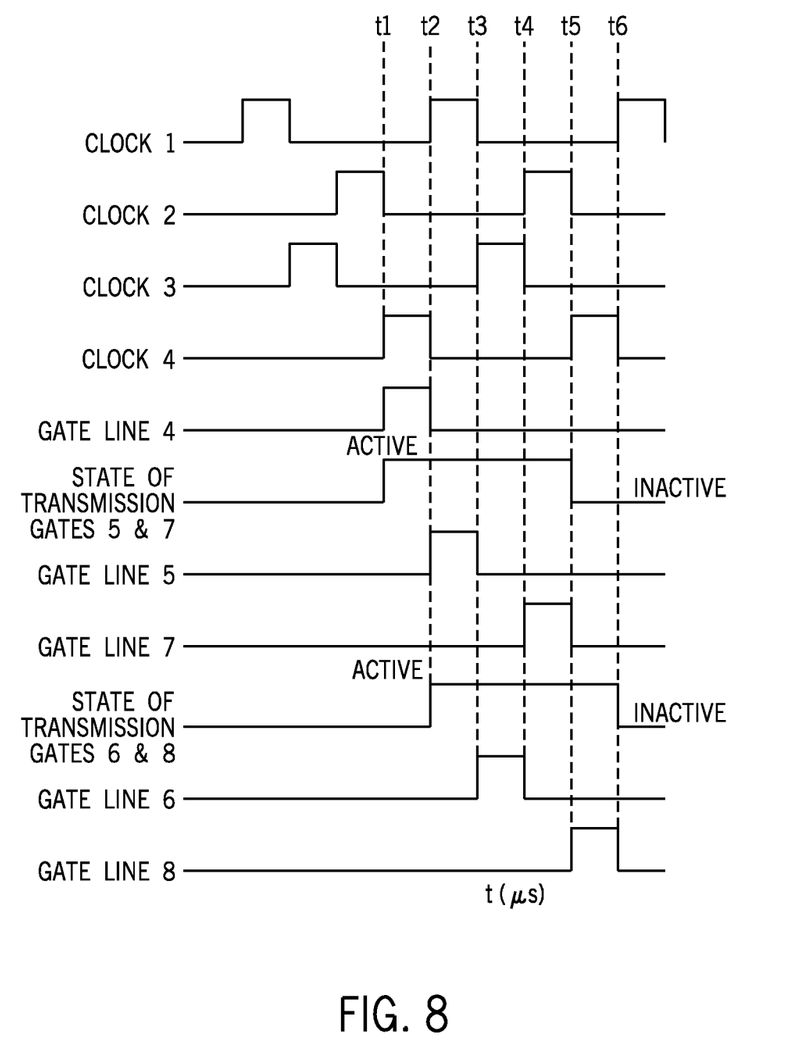
FIG. 8 is a timing diagram of clock signals and states of various gate lines and transmission gate circuits that may operate as part of the gate drive circuit of FIG. 7, in accordance with an embodiment.

With the foregoing in mind, it is apparent that the gate drive circuit 60 disposed either side of the display 12 operates independently with respect to each other. That is, the gate drive circuit 60 disposed on the left side of the display 12 may operate based on clock signals received via bus lines 68, while the gate drive circuit 60 disposed on the right side of the display 12 may operate based on clock signals received via bus lines 70. As can be appreciated, to ensure that two gate lines are not driven by two different gate circuit drives 60 at the same time, the clock signals from clocks 1-4 may be selected to ensure that one gate drive line 62 is driven at any given time. For instance, as shown in FIG. 8, each clock signal from clocks 1-4 occurs during distinct time intervals. In this way, the gate drive circuit 60 driving the odd-numbered gate drive lines 62 are not related to the gate drive circuit driving the even-numbered gate drive lines 62, except for that the clock signals that drive each respective side of the display 12 are coordinated not to interfere with each other.

It should be noted that when using the clock signals to drive each latch circuit 64, each latch circuit 64 may continuously consume energy when a clock signal is being input into the latch circuit 64 even though the respective latch circuit 64 may be in an inactive state. That is, the clock signals provided to the latch circuits 64 drive a drain side of input transistors in each respective latch circuit 64. The drain side of the input transistor corresponds to a fringe capacitor that consumes energy inefficiently. Considering the total number of latch circuits 64 present in the gate drive circuit 60, it is apparent that each latch circuit 64 consumes energy inefficiently by using the clock signals to drive the respective latch circuit 64. Moreover, since the clock signals are used to drive the latch circuit 64 and the transmission gates 66, two different pairs of bus lines 68 are used to provide the clock signals to the latch circuits 64 and the transmission gates 66. By using two different pairs of bus lines to provide the same clock signals, the gate drive circuitry 60 again consumes energy inefficiently by losing energy via resistive properties of each bus line.

More Efficient Gate Drive Circuitry

Keeping the foregoing in mind, FIG. 7 illustrates one embodiment in which gate drive circuit 80 and gate drive circuit 82 may not drive the latch circuits 64 using clock signals, as compared to the gate drive circuit 60 of FIG. 5. Instead, as depicted in FIG. 7, the output of one transmission gate 66 of one gate drive circuit (e.g., gate drive circuit 80) may be used to drive a latch circuit 64 disposed within another gate drive circuit (e.g., gate drive circuit 82). As such, clock signals are not used to drive each of the latch circuits 64 of the gate drive circuit 80 or the gate drive circuit 82. As a result, each latch circuit 64 does not operate as a fringe capacitor, and thus does not consume energy inefficiently.

As an advantage to not driving latch circuits 64 with clock signals, gate drive circuits 80 and 82 include just one pair of bus lines 68 or 70. That is, since the latch circuits 64 are no longer driven by clock signals, clock signal bus lines dedicated to driving latch circuits 64 are obsolete. Moreover, in addition to not driving the latch circuits 64 with clock signals, the gate drive circuit 80 and the gate drive circuit 82 may each employ just one respective latch circuit 64 to control the operation of two respective transmission gates 66. Accordingly, by having fewer clock signal bus lines and half as many latch circuits 64 in the gate drive circuits 80 and 82, the electronic device 10 may have a smaller bezel region or border surrounding the display 12 of the electronic device 10, thereby enhancing a user's experience with the display 12.

Additionally, by removing the fringe capacitance operation of the latch circuits 64 and by reducing the total number of latch circuits used in the gate drive circuits 80 and 82, the electronic device 10 may operate the display 12 more efficiently with respect to energy as compared to a corresponding electronic device 10 employing the gate drive circuit 60.

Referring now to FIG. 7, each latch circuit 64 may use stored states to control the operation of two transmission gates 66. For example, latch 1 may receive a set signal via data line 84. The set signal may be used to initialize the display 12 to begin depicting images. As such, the set signal may be provided via the processor 18 or the like when attempting to display images via the display 12. As shown in FIG. 7, in one embodiment, the set signal may be provided to the first latch circuit 64 and to the last latch circuit 64 of the gate drive circuitry 80 or 82. In this way, the gate lines 62 may be driven from the top of the display 12 to the bottom or from the bottom of the display 12 to the top.

In one embodiment, the set signal may cause the latch circuit (e.g., latch 1) to change states (e.g., from inactive to active). Once activated, latch 1 may transfer the new state status to transmission gate 1 and transmission gate 3, both of which are coupled to latch 1. As such, transmission gate 1 and transmission gate 3 may be active or prepared to drive gate line 1 and gate line 3, respectively. As shown in FIG. 7, transmission gate 1 is coupled to clock 1 and transmission gate 3 is coupled to clock 2, such that transmission gate 1 may drive gate line 1 according to the clock signal from clock 1 and transmission gate 3 may drive gate line 3 according to the clock signal from clock 2.

After illuminating the pixels disposed on gate line 1, the electrical signal driving gate line 1 may be provided to latch 2 to set latch 2. That is, gate line 1 may be coupled to latch 2 of the gate drive circuit 82 on the right side of the display 12. As such, upon receiving the electrical signal from gate line 1, latch 2, in turn, may transfer the new state status to transmission gate 2 and transmission gate 4, both of which are coupled to latch 2. Transmission gate 2 and transmission gate 4 may then be active or prepared to drive gate line 2 and gate line 4, respectively. Since transmission gate 2 is coupled to clock 3 and transmission gate 4 is coupled to clock 4, transmission gate 2 may drive gate line 2 according to the clock signal from clock 3 and transmission gate 4 may drive gate line 4 according to the clock signal from clock 4.

To continue driving the subsequent gate lines 62, gate line 4 may be coupled to latch 1 and latch 3 of the gate drive circuit 80. As such, the electrical signal driving gate line 4 may reset latch 1, thereby causing latch 1 to turn to an inactive state. The same electrical signal driving gate line 4 may also set latch 3, thereby causing latch 3 to turn to active state. After latch 3 becomes active, latch 3 may transfer the active state to transmission gate 5 and transmission gate 7, as described above with respect to transmission gate 1 and transmission gate 3. The remaining latch circuits 64 and transmission gates 66 of the gate drive circuit 80 and the gate drive circuit 82 may be arranged according to the scheme described above and illustrated in FIG. 7.

By employing the scheme illustrated in FIG. 7, the gate drive circuit 80 and the gate drive circuit 82 operate in conjunction with each other. That is, most latch circuits 64 of the gate drive circuit 80 may be set and reset by various gate lines 62 driven by transmission gates 66 of the gate drive circuit 82. In this way, instead of operating independently of each other, the gate drive circuit 82 may coordinate or contribute to the operation of the gate drive circuit 80. As such, the gate drive circuit 80 and the gate drive circuit 82 may drive the gate lines 62 without relying on just clock signals to coordinate the operations of the transmission gates 66.

Referring briefly back to the convention gate drive circuit 60 of FIG. 5, the transmission gates 66 drive the gate lines 62 according to the clock signals received from clocks 1-4 via bus lines 68 and bus lines 70. As such, if any clock signal was altered due to noise or resistance along the bus lines 68 or the bus lines 70, the likelihood of two different gate lines 62 driven at the same time may increase. Moreover, since each gate drive circuit 60 of FIG. 5 operate independently of each other, both gate drive circuitries 60 may not be aware or have any way to prevent gate lines 62 from being driven at the same time from both sides of the display 12.

In contrast to the gate drive circuit 60, by using the electrical signal driving the gate line 62 from one side of the display 12 to control the latch circuit 64 located on the other side of the display 12, the gate drive circuit 80 and the gate drive circuit 82 provides additional protection with regard to preventing multiple transmission gates 66 on either side of the display 12 from driving multiple gate lines 62 at the same time. Moreover, by reducing the number of latch circuits 64 employed in the gate drive circuit 80 and the gate drive circuit 82, the bezel region or border of the display 12 may be reduced since fewer electrical components may reside in the region. Additionally, by driving the latch circuits 64 using data line 84 or gate lines 62, and not using clock signals, each latch circuit 64 of the gate drive circuits 80 and 82 consume significantly less energy as compared to the gate drive circuit 60 of FIG. 5. Moreover, since clock signals are not provided as inputs to the latch circuits 64, each gate drive circuit 80 and 82 does not include more than one bus line 68 or 70 providing the same clock signal. As such, since the bezel region of the electronic device 10 does not include the additional bus lines 68 or 70, the bezel region may be reduced even further, thereby providing additional space on the electronic device 10 for the display 12.

Although the embodiments discussed herein have been described as using one latch circuit 64 for two transmission gates 66 and one bus line 68 or 70 for each gate drive circuit 80 or 82, it should be noted that the embodiments discussed herein are not limited to this schematic. That is, in other embodiments, one latch circuit 64 for more than two transmission gates 66. In the same manner, additional bus lines 68 or 70 that may include additional clock signals may be provided for each gate drive circuit 80 or 82 to have a lower latch circuit to transmission gate ratio. For example, by adding one additional bus line that provides two additional clock signals to the gate drive circuit 80 or 82, one latch circuit 64 may be used to control the operation of four transmission gate 66 if the clock signals are positioned properly.

Keeping the foregoing in mind, FIG. 8 illustrates a timing diagram that describes how the electrical signal associated with one gate line 62 driven by one transmission gate 66 may control the operation of another transmission gate 66 located on the opposite side of the display 12. Referring now to FIG. 8, the clock signals 1-4 are illustrated such that each clock signal occurs during a distinct time period. Moreover, each clock signal is scheduled such that a gate line 62 from one side of the display 12 is driven and then a gate line 62 from the opposite side of the display 12 is driven immediately thereafter.

For example, referring to latch 3 of FIG. 7 and the timing diagram of FIG. 8, after gate line 4 is driven by transmission gate 4, the electrical signal associated with gate line 4 may be provided to latch 3 as a set signal. As such, upon receiving the clock signal from clock 4 at time t1, the state of transmission gates 5 and 7, which are coupled to latch 3, may be set to active or high, as shown in FIG. 8.

Once the state of transmission gates 5 and 7 are active, the clock signal input into transmission gate 5 from clock 1 may cause the transmission gate 5 to drive gate line 5. That is, the clock signal of clock 1 at time t2 is transmitted through transmission gate 5 to drive gate line 5 since transmission gate 5 is in an active state between time t1 and time t5.

After gate line 5 is driven by transmission gate 5, the electrical signal associated with gate line 5 may be provided to latch 4 as a set signal. At approximately the same time, the electrical signal associated with gate line 5 may be provided to latch 2 as a reset signal. In this way, transmission gates 2 and 4 may be reset to a non-active state, thereby preventing gate lines 2 and 4 from being driven until latch 2 again receives a set signal. Referring back to latch 4, upon receiving the clock signal from clock 4 at time t1, the state of transmission gates 6 and 8, which are coupled to latch 4, may be set to active or high. Transmission gate 6 may then drive gate line 6 according to the clock signal received at time t3 from clock 3.

After transmission gate 6 drives gate line 6, transmission gate 7 may drive gate line 7 based on a clock signal received at time t4 from clock 2. In the same manner, after transmission gate 7 drives gate line 7, transmission gate 8 may drive gate line 8 based on a clock signal received at time t5 from clock 4. At approximately the same time that gate line 8 is driven, the electrical signal driving gate line 8 is provided to latch 3, thereby resetting latch 3 to an inactive state at time t5 and turning transmission gates 5 and 7 to an off or inactive state.

In addition to being coupled to latch 3, gate line 8 may also be coupled to the next latch circuit 64 (e.g., latch 5) of the gate drive circuit 80. As such, the electrical signal driving gate line 8 may cause the next latch circuit 64 to change states. By employing the scheme described above for activating and deactivating latch circuits 64, each gate drive circuit 80 and 82 may have just one latch circuit 64 active at any given time. As a result, the probability of driving two gate lines 62 by one gate drive circuit 80 or 82 is reduced as compared to the gate drive circuit 60.

In certain embodiments, it may be beneficial to include a data line 86 that provides a reset signal to each respective latch circuit 64 of the gate drive circuits 80 and 82. As such, the processor 18 may reset each latch circuit 64 via the data line 84 to ensure that the driving scheme described above is implemented effectively. That is, by sending a hard reset signal to each latch circuit 64, the processor 18 may ensure that none of the latch circuits 64 are operating in an incorrect state when the gate drive circuits 80 and 82 are employed to depict images on the display 12.

Figure 9:
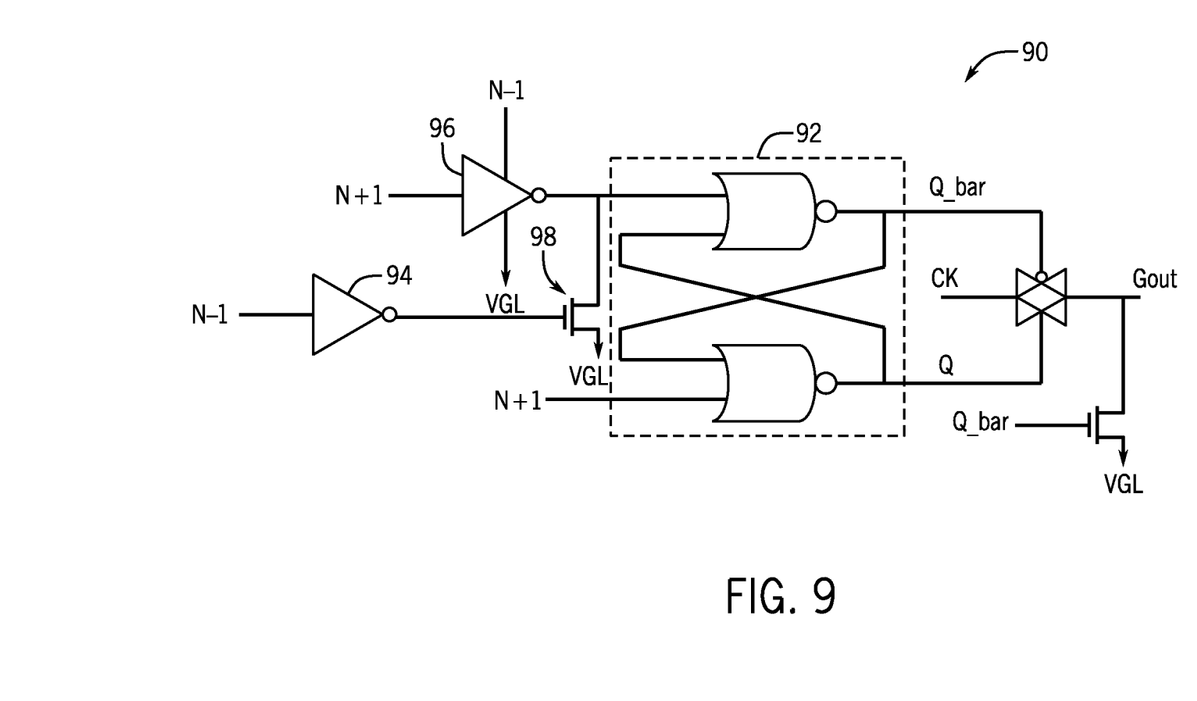
FIG. 9 is a schematic diagram of a latch circuit in the gate drive circuit of FIG. 7, in accordance with an embodiment.

Although the gate drive circuits 80 and 82 may provide an improved manner in which to ensure that two gate lines 62 are not driven at the same time, in certain embodiments, the latch circuits 64 of the gate drive circuits 60, 80, and 82 of FIGS. 5 and 7 may be designed according to logic schematic 90 of FIG. 9. Referring to FIG. 9, the latch circuit 64 may include a D flip-flop circuit 92, an inverter 94, an inverter 96, and a switch 98.

Generally, by employing the logic schematic 90 of FIG. 9 for the latch circuit 64, the latch circuit 64 may provide additional protection to prevent two gate lines 62 of the display 12 being driven at the same time. That is, the logic schematic 90 uses state information regarding the state of a previous latch circuit 64 and a subsequent latch circuit 64 to ensure that a respective latch circuit 64 will not cause more than one gate line 62 from being driven at the same time.

Generally, the truth table for the logic schematic 90 may be summarized according to the following table.

TABLE 1

| Truth Table | | | |
|---|---|---|---|
| N − 1 | N + 1 | Q_BAR | Q |
| 1 | 0 | 0 | 1 |
| 0 | 0 | Hold | Hold |
| 0 | 1 | 1 | 0 |
| 1 | 1 | 1 | 0 |

As shown in Table 1, when the preceding latch circuit 64 (i.e., N−1) is active (i.e., 1) and the subsequent latch circuit 64 (i.e., N+1) is inactive, the Q line is high, thereby allowing the respective latch circuit 64 (i.e., N) to set or become active. However, when both the preceding latch circuit 64 and the subsequent latch circuit 64 are inactive, the Q line and the Q_bar line wait in a hold position. As such, the respective latch circuit 64 may not change states, and instead may just remain in its present state.

When the preceding latch circuit 64 is inactive and the subsequent latch circuit 64 is active, the Q line is active and the Q_bar line is inactive. As such, the respective latch circuit 64 is reset to its original state. Finally, when the preceding latch circuit 64 and the subsequent latch circuit 64 are both active, the Q line is active and the Q_bar line is inactive. As such, the respective latch circuit 64 is again reset to its original state, thereby preventing two latch circuits 64 from being active at the same time.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

What is claimed is:

1. A system, comprising:
   a first circuit configured to drive a first gate line and a second gate line within a display, wherein the first circuit comprises:
   a first latch circuit configured to directly couple to a first transmission gate and a second transmission gate, wherein the first transmission gate is configured to directly couple to the first gate line, and wherein the second transmission gate is configured to directly couple to the second gate line; and
   a second circuit configured to drive a third gate line and a fourth gate line within the display, wherein the second circuit comprises:
   a second latch circuit configured to directly couple to a third transmission gate and a fourth transmission gate, wherein the third transmission gate is configured to directly couple to the third gate line, and wherein the fourth transmission gate is configured to directly couple to the fourth gate line;
   wherein the first gate line is configured to directly couple to the second latch circuit; and
   a third latch circuit configured to directly couple to a fifth transmission gate and a sixth transmission gate;
   wherein the fourth gate line is configured to directly couple to the first latch circuit and the third latch circuit.

2. The system of claim 1, wherein the first gate line is configured to provide a first electrical signal to the second latch circuit, wherein the first electrical signal is configured to change a state of the second latch.

3. The system of claim 1, wherein the fourth gate line is configured to provide a second electrical signal, and wherein the second electrical signal is configured to set the first latch circuit to an inactive state and set the third latch circuit to the active state.

4. The system of claim 1, wherein the first latch circuit is configured to set the first transmission gate and the second transmission gate to an active or an inactive state, and wherein the second latch circuit is configured to set the third transmission gate and the fourth transmission gate to the active or the inactive state.

5. The system of claim 1, comprising:
   a first bus line configured to provide a first clock signal from a first clock, wherein the first bus line is configured to directly couple to the first transmission gate; and
   a second bus line configured to provide a second clock signal from a second clock, wherein the second bus line is configured to directly couple to the second transmission gate.

6. The system of claim 5, wherein the first clock signal is configured to cause the first transmission gate to send a first electrical signal to the first gate line, and wherein the second clock signal is configured to cause the second transmission gate to send a second electrical signal to the second gate line.

7. The system of claim 5, wherein the first clock signal comprises a first pulse having a duration, wherein the second clock signal comprises a second pulse that occurs after the duration expires at an end of the first pulse.

8. The system of claim 7, wherein the second pulse has a period that corresponds to the duration.

9. An electronic device, comprising:
   a display; and
   a first gate drive circuit configured to drive a first set of gate lines of the display; and
   a second gate drive circuit configured to drive a second set of gate lines of the display, wherein at least one gate line of the first set of gate lines is adjacent to at least one gate line of the second set of gate lines, and wherein the first gate drive circuit is configured to control a first operation of the second gate drive circuit.

10. The electronic device of claim 9, wherein the second gate drive circuit comprises at least one latch circuit configured to store an active state or an inactive state.

11. The electronic device of claim 10, wherein the first gate drive circuit is configured to control the first operation of the second gate drive circuit by changing the state of the at least one latch circuit.

12. The electronic device of claim 9, wherein the second gate drive circuit is configured to control a second operation of the first gate drive circuit.

13. The electronic device of claim 9, wherein the first gate drive circuit is disposed within a first bezel region of the electronic device, wherein the second gate drive circuit is disposed within a second bezel region of the electronic device, and wherein the first bezel region and the second bezel region are located on opposite sides of the electronic device.

14. The electronic device of claim 9, wherein the display is part of a media device, a laptop computer, a desktop computer, a tablet computer, a phone device, or any combination thereof.

15. A method, comprising:
receiving, at a latch circuit, a set signal that causes the latch circuit to store state information;
sending, from the latch circuit, the state information to a first transmission gate and a second transmission gate, wherein the first transmission gate and the second transmission gate drive a first gate line and a second gate line associated with display when the state information corresponds to an active state; and
receiving, at the latch circuit, an electrical signal from directly via a third gate line associated with the display, wherein the third gate line is directly coupled to a third transmission gate, wherein the electrical signal causes the latch circuit to reset to an inactive state thereby deactivating the first transmission gate and the second transmission gate, and wherein the latch circuit, the first transmission gate, and the second transmission gate is disposed on a first side of the display and the third transmission gate is disposed on a second side of the display opposite the first side.

16. The method of claim 15, wherein the electrical signal drives the third gate line.

17. The method of claim 15, wherein the second gate line and the third gate line are directly adjacent to each other.

18. A gate drive circuit, comprising:
a latch circuit;
a first transmission gate; and
a second transmission gate, wherein the first transmission gate and the second transmission gate are configured to couple to the latch circuit, and wherein the first transmission gate and the second transmission gate are configured to couple to a first gate line and a second gate line, respectively;
wherein the latch circuit is configured to receive an electrical signal from a third gate line adjacent to the second gate line, and wherein the electrical signal is configured to reset a state of the latch circuit.

19. The gate drive circuit of claim 18, wherein the latch circuit comprises a D flip-flop circuit.

20. The gate drive circuit of claim 18, wherein the latch circuit is configured to prevent itself from being in an active state when a preceding latch in the gate drive circuit and a subsequent latch in the gate drive circuit are both in the active state.

21. The gate drive circuit of claim 18, comprising a first bus line and a second bus line configured to provide first clock signal and a second clock signal to the first transmission gate and the second transmission gate, respectively.

22. An electronic display, comprising:
a first gate drive circuit configured to drive a first set of gate lines of the display; and
a second gate drive circuit configured to drive a second set of gate lines of the display, wherein the first gate drive circuit is configured to control a first operation of the second gate drive circuit, and wherein the first gate drive circuit and the second gate drive circuit each comprises at least one latch circuit configured to directly couple to at least two transmission gates.

23. The electronic display of claim 22, wherein the first gate drive circuit and the second gate drive circuit each comprises at least four bus lines configured to provide at least four clock signals to the at least two transmission gates.

* * * * *